(12) United States Patent
Kitagawa et al.

(10) Patent No.: US 7,559,128 B2
(45) Date of Patent: Jul. 14, 2009

(54) METHOD OF MANUFACTURING A PIEZOELECTRIC/ELECTROSTRICTIVE DEVICE

(75) Inventors: Mutsumi Kitagawa, Inuyama (JP); Koji Kimura, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 460 days.

(21) Appl. No.: 11/252,122

(22) Filed: Oct. 17, 2005

(65) Prior Publication Data

US 2006/0032034 A1    Feb. 16, 2006

Related U.S. Application Data

(62) Division of application No. 10/601,125, filed on Jun. 20, 2003, now Pat. No. 7,009,328.

(51) Int. Cl.
*H04R 17/00* (2006.01)

(52) U.S. Cl. .................. 29/25.35; 29/592.1; 310/321; 310/328; 310/330; 310/331; 310/332

(58) Field of Classification Search ............... 29/25.35; 310/321, 328, 330–332
See application file for complete search history.

(56) References Cited

U.S. PATENT DOCUMENTS

| | | | |
|---|---|---|---|
| 5,430,344 A | 7/1995 | Takeuchi et al. | |
| 5,691,594 A | 11/1997 | Takeuchi et al. | |
| 5,872,415 A | 2/1999 | Dreifus et al. | |
| 5,984,458 A | 11/1999 | Murai | |
| 6,147,438 A | 11/2000 | Nishiwaki et al. | |
| 6,217,979 B1 * | 4/2001 | Takeuchi et al. | ............ 428/138 |
| 6,247,371 B1 | 6/2001 | Namerikawa et al. | |
| 6,387,225 B1 | 5/2002 | Shimada et al. | |
| 6,523,943 B1 | 2/2003 | Fukui | |
| 6,882,089 B2 * | 4/2005 | Kashiwaya et al. | ......... 310/358 |
| 2001/0022487 A1 | 9/2001 | Takeuchi et al. | |
| 2002/0130589 A1 | 9/2002 | Hamada et al. | |
| 2003/0062807 A1 | 4/2003 | Takeuchi et al. | |
| 2003/0067251 A1 | 4/2003 | Kashiwaya et al. | |

FOREIGN PATENT DOCUMENTS

| | | |
|---|---|---|
| EP | 0 930 165 A1 | 7/1999 |
| EP | 1 291 317 A2 | 3/2003 |
| JP | 59-023613 A1 | 2/1984 |
| JP | 10-330195 A1 | 12/1998 |
| JP | 2001-338835 A1 | 12/2001 |

* cited by examiner

*Primary Examiner*—Paul D Kim
(74) *Attorney, Agent, or Firm*—Burr & Brown

(57) ABSTRACT

A piezoelectric/electrostrictive device is provided including a substrate section and an operation section disposed on the substrate section. The operation section includes a piezoelectric/electrostrictive film and an electrode film, and the device operates by displacement of the operation section. The piezoelectric/electrostrictive films and electrode films are alternately laminated so that uppermost and lowermost layers form the electrode films. The operation section and the substrate section are integrally fired, and the substrate section is ceramic material containing a titanium element.

3 Claims, 7 Drawing Sheets

METHOD OF MANUFACTURING A PIEZOELECTRIC/ELECTROSTRICTIVE DEVICE

CROSS REFERENCE TO RELATED APPLICATION

This application is a division of U.S. Application Ser. No. 10/601,125, filed Jun. 20, 2003, now allowed, the entirety of which is incorporated herein by reference.

BACKGROUND AND RELATED ART OF THE INVENTION

The present invention relates to a piezoelectric/electrostrictive device. In more detail, the present invention relates to piezoelectric/electrostrictive devices made of piezoelectric/electrostrictive film which can be used for active devices such as various actuators or transducers, frequency region function components (filter), vibrators, resonators, and oscillators of transformers, and a discriminator, and sensor devices for various sensors such as an ultrasonic sensor, acceleration sensor, angular velocity sensor, impact sensor, and mass sensor, and the like.

In recent years, a piezoelectric/electrostrictive actuator has been used as an ink pump of a print head for use in an ink jet printer. For example, in Japanese Patent Application Laid-Open No. 6-40035 (hereinafter referred to as Patent Document 1), one example of an ink jet print head is disclosed in which the piezoelectric/electrostrictive actuator shown in FIGS. 9 and 10 is used.

An ink jet print head 140 is formed by integrally bonding an ink nozzle member 142 to a piezoelectric/electrostrictive actuator 145 made of a piezoelectric/electrostrictive film, and ink supplied to a cavity 146 formed in the piezoelectric/electrostrictive actuator 145 made of a piezoelectric/electrostrictive film is spouted through nozzle holes 154 disposed in the ink nozzle member 142.

In further detail, the piezoelectric/electrostrictive actuator 145 made of a piezoelectric/electrostrictive film is constituted of a substrate section 144 (ceramic substrate in Patent Document 1) and an operation section 178 (the piezoelectric/electrostrictive device in Patent Document 1) formed integrally with the substrate section 144. For the substrate section 144, a closure plate 166 and connecting plate 168 each having thin-walled flat plate shapes are integrally formed in a structure in which the plates are superposed upon each other via a spacer plate 170. In the connecting plate 168, first and second openings for communication 172 and 174 are formed in positions opposite to through holes 156 and orifice holes 158 formed in an orifice plate 150 of the ink nozzle member 142. The first opening for communication 172 has an inner diameter which is substantially the same as or slightly larger than that of the through hole 156. On the other hand, the second opening for communication 174 has a diameter which is larger than that of the orifice hole 158 by a predetermined dimension. A plurality of longitudinally rectangular windows 176 are formed in the spacer plate 170. Moreover, the spacer plate 170 is superposed upon the connecting plate 168 so that each one first opening for communication 172 and second opening for communication 174 disposed in the connecting plate 168 are opened with respect to each window 176. The closure plate 166 is superposed on the surface of the spacer plate 170 opposite to that on which the connecting plate 168 is superposed, and the openings of the windows 176 are covered with the closure plate 166. Accordingly, the cavities 146 connected to the outside through the first and second openings for communication 172 and 174 are formed in the substrate section 144.

For the piezoelectric/electrostrictive actuator 145 made of a piezoelectric/electrostrictive film, small pieces do not have to be bonded to one another piece by piece to form the operation section, a conventional problem related to the bonding is reduced or prevented, and superior operation characteristics can steadily be obtained. Moreover, the actuator can easily be prepared and can advantageously be formed to be compact.

In the piezoelectric/electrostrictive actuator 145 made of a piezoelectric/electrostrictive film structured and characterized in this manner, in recent years, in pursuit of enhancement of an image quality of the ink jet printer, there has been a demand for further miniaturization and higher integration of the piezoelectric/electrostrictive actuator. However, there have occurred problems that displacement is reduced and a necessary amount of droplets cannot be spouted.

SUMMARY OF THE INVENTION

The present invention has been developed in view of the problems of the conventional art, and an object thereof is to provide a superior piezoelectric/electrostrictive device made of piezoelectric/electrostrictive film in which high integration is possible without any structure laminated using an adhesive, a larger displacement is further obtained with the same driving voltage, response speed is high, and generation force is large, and to provide a manufacturing method of the device. As a result of progress of studies on the above-described problems, a stress remaining in a piezoelectric/electrostrictive film inhibits development of original characteristics of piezoelectric/electrostrictive materials, it is supposed that sufficient displacement cannot be generated, and the following invention has been attained.

That is, according to the present invention, there is provided a piezoelectric/electrostrictive device made of piezoelectric/electrostrictive film which comprises: a substrate section; and an operation section disposed on the substrate section and constituted of a piezoelectric/electrostrictive film and an electrode film; said device being capable of operating by displacement of the operation section, wherein the operation section comprises the piezoelectric/electrostrictive films and electrode films alternately laminated so that uppermost and lowermost layers form the electrode films, wherein the operation and substrate sections are integrated by firing, and wherein the substrate section is constituted of a ceramics containing a titanium element. For the substrate section, a content of a titanium element of a projected section projected by the electrode film of the lowermost layer of the operation section is different from that of the titanium element of a non-projected section.

In the piezoelectric/electrostrictive device made of piezoelectric/electrostrictive film according to the present invention, for the substrate section, the content of the titanium element of the projected section projected by the electrode film of the lowermost layer of the operation section is preferably different from that of the titanium element of the non-projected section. Moreover, at this time, the content of the titanium element of the projected section is preferably larger than that of the titanium element of the non-projected section. The substrate section preferably contains 0.3 to 4% by mass of the titanium element in an equivalent amount of titanium oxide in the projected section projected by the electrode film of the lowermost layer of the operation section. Furthermore, the ceramic constituting the substrate section is preferably zirconium oxide.

In the piezoelectric/electrostrictive device made of piezoelectric/electrostrictive film according to the present invention, the substrate section preferably has a thickness of 2 to 10 μm. The electrode film is preferably constituted of a material containing platinum which is a major component, and the electrode film is preferably dense in at least the lowermost layer which contacts the substrate section. Furthermore, in the piezoelectric/electrostrictive device made of piezoelectric/electrostrictive film according to the present invention, the operation section preferably includes two to four layers of the piezoelectric/electrostrictive films.

Next, according to the present invention, there are provided two manufacturing methods of piezoelectric/electrostrictive device made of piezoelectric/electrostrictive film as follows. A first manufacturing method of the piezoelectric/electrostrictive device made of piezoelectric/electrostrictive film (hereinafter also referred to simply as the first manufacturing method) is a manufacturing method of a piezoelectric/electrostrictive device made of piezoelectric/electrostrictive film which comprises: a substrate section; and an operation section disposed on the substrate section and constituted of a piezoelectric/electrostrictive film and an electrode film; said device being capable of operating by displacement of the operation section, wherein the operation section comprises the piezoelectric/electrostrictive films and electrode films alternately laminated so that uppermost and lowermost layers form the electrode films, wherein the operation and substrate sections are integrated by firing, and wherein the substrate section is constituted of a ceramics containing a titanium element. The manufacturing method comprises the steps of: using a conductor material containing 0.3 to 8% by mass of titanium oxide as a material of the electrode film of the lowermost layer which contacts the substrate section to carry out a heat treatment so that the substrate section contains the titanium element. In the first manufacturing method of the piezoelectric/electrostrictive device made of piezoelectric/electrostrictive film according to the present invention, an average particle size of titanium oxide contained in the material of the electrode film is preferably 0.05 to 0.4 μm.

Moreover, a second manufacturing method of a piezoelectric/electrostrictive device made of piezoelectric/electrostrictive film which comprises: a substrate section; and an operation section disposed on the substrate section and constituted of a piezoelectric/electrostrictive film and an electrode film; said device being capable of operating by displacement of the operation section, wherein the operation section comprises the piezoelectric/electrostrictive films and electrode films alternately laminated so that uppermost and lowermost layers form the electrode films, wherein the operation and substrate sections are integrated by firing, and wherein the substrate section is constituted of a ceramics containing a titanium element. In the manufacturing method, the substrate section is constituted of a material containing titanium oxide having been prepared beforehand. It is to be noted that the manufacturing method of the piezoelectric/electrostrictive device made of piezoelectric/electrostrictive film simply mentioned in the present specification includes both the first and second manufacturing methods.

DETAILED DESCRIPTION OF THE INVENTION

Figure 1:
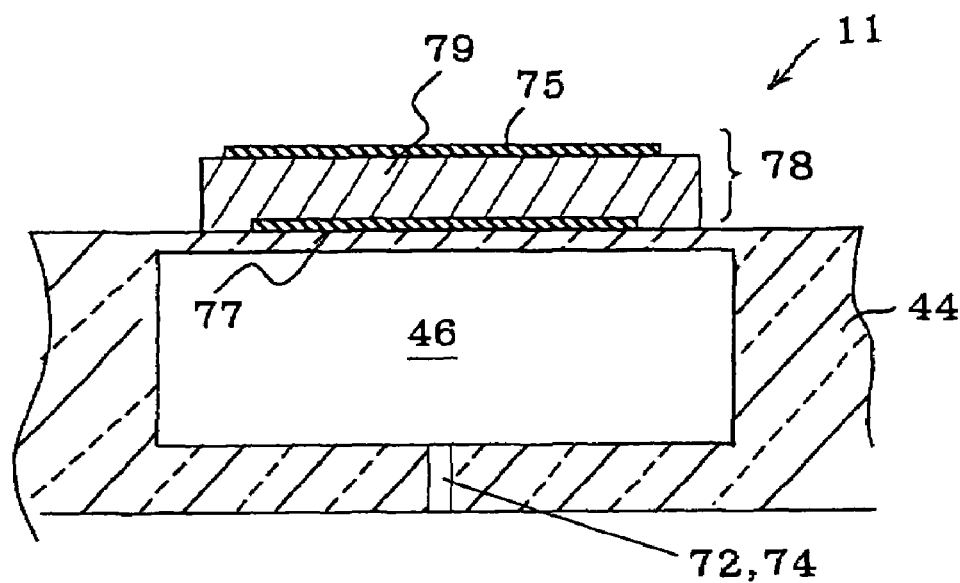
FIG. 1 is a sectional view showing one embodiment of a piezoelectric/electrostrictive device made of piezoelectric/electrostrictive film according to the present invention.

Modes for carrying out a piezoelectric/electrostrictive device made of piezoelectric/electrostrictive film and a manufacturing method according to the present invention will concretely be described hereinafter, but the present invention is not limited to these when interpreted, and the present invention can variously be changed, modified, or improved based on knowledge of a person skilled in the art without departing from the scope of the present invention.

The present invention relates to the piezoelectric/electrostrictive device made of piezoelectric/electrostrictive film which operates by displacement of an operation section or operates by application of a stress onto the operation section. A structure of the piezoelectric/electrostrictive device made of piezoelectric/electrostrictive film according to the present invention includes a substrate section constituted of a ceramic and an operation section disposed on the substrate section, and further the operation section is constituted of a piezoelectric/electrostrictive film and electrode film.

In the piezoelectric/electrostrictive device made of piezoelectric/electrostrictive film according to the present invention, the operation section includes the piezoelectric/electrostrictive films and electrode films alternately laminated so that uppermost and lowermost layers form the electrode films, the operation section and substrate section are integrally fired, and characteristics also lie in that the substrate section contains a titanium element. Here, the uppermost and lowermost layers of the electrode films in the operation section mean relative upper and lower layers while the lower layer (direction) is disposed on a substrate section side, and the lower layer (direction) does not mean a gravitational direction. This also applies to lower and upper electrodes described later.

In the piezoelectric/electrostrictive device made of piezoelectric/electrostrictive film constituted by integrally firing the operation section and substrate section, the superiority or inferiority of characteristics is influenced by a firing condition of the piezoelectric/electrostrictive film. This is because with application of a firing shrinking force during sintering with the piezoelectric/electrostrictive film onto the substrate section, the substrate section cannot absorb the shrinking force, and a large firing stress remains in the piezoelectric/electrostrictive film. For the piezoelectric/electrostrictive device made of piezoelectric/electrostrictive film according to the present invention, the substrate section contains a predetermined amount of titanium elements, and therefore the device has a property that the device is capable of being appropriately deformed by an external force at a high temperature which is approximately a firing temperature of the piezoelectric/electrostrictive film. Even when the firing shrinking force during the firing integration with the piezoelectric/electrostrictive film is applied to the substrate section, the substrate section itself can absorb the contractive force of shrinking, and a large firing stress does not remain in the piezoelectric/electrostrictive film. Therefore, the piezoelectric/electrostrictive device made of piezoelectric/electrostrictive film according to the present invention can be a device constituted of the piezoelectric/electrostrictive film which has a material characteristic similar to that of a so-called bulk material.

The titanium element contained in the substrate section capable of producing the above-described effect may uniformly exist in the whole substrate section, but a content of the element preferably differs with a projected section projected by the electrode film of the lowermost layer of the operation section and a non-projected section. More preferably, the projected section has a content of the titanium element larger than that of the non-projected section. This is because in the substrate section, an existing amount of the titanium element is desired to be changed in accordance with a function fulfilled by the substrate section. That is, when the titanium element content of the section projected by the electrode film of the lowermost layer is increased, the piezoelectric/electrostrictive film having a small remaining stress is obtained, and a large displacement based on a satisfactory material characteristic can be developed. On the other hand, since the titanium element amount of the non-projected section is small, it is possible to maintain mechanical strength of the substrate section.

The amount of the titanium element contained in the substrate section it not limited, but the content is preferably 0.3 to 4% by mass in terms of an equivalent amount of titanium oxide, more preferably 0.4 to 2.5% by mass in the projected section projected by the electrode film of the lowermost layer (of the operation section). In this range, the above-described effect becomes larger without influencing a composition of the piezoelectric/electrostrictive film. It is to be noted that the projected section of the substrate section projected by the electrode film of the lowermost layer refers to a portion of the substrate section within a projection area, when a shape of the electrode film of the lowermost layer of the operation section is projected toward a depth direction (inwards) of the substrate section from a direction vertical to a surface where the substrate section contacts the electrode film and reverse to the substrate section. The non-projected section is a section other than the projected section in the substrate section.

The material constituting the substrate section can be selected from many ceramic materials described later, and is not limited, but zirconium oxide is preferably used. When the substrate section is formed to be thin, the mechanical strength can be increased and toughness can be raised. Additionally, since reactivity with a piezoelectric/electrostrictive material and electrode material constituting the operation section is small, an addition effect of the titanium element can effectively be used.

A thickness of the substrate section is not limited, but is preferably 50 µm or less, more preferably 20 µm or less and further preferably about 2 to 10 µm, and it may have a cavity structure since the thin substrate works as a supporting member. This thickness is based on a manufacturing method, and as described later, a material containing the titanium element beforehand is not used in the substrate section. When the titanium element is diffused from the electrode film by heat treatment, the above-described thickness is preferable for substantially uniformly diffusing the titanium element in the depth direction of the substrate section.

The material constituting the electrode film of the operation section can be selected from many conductor materials described later, and is not limited, but the film is preferably constituted of a material which contains platinum as a major component. This is because the reactivity with a piezoelectric/electrostrictive material at a high temperature is small, a melting point is high, and stability is high even at the high temperature. Especially preferably, platinum containing titanium oxide is used in the electrode film of the lowermost layer. When a small amount of titanium element is contained also in the electrode of the lowermost layer together with the substrate section, displacement characteristic of the operation section is further improved. The electrode film is preferably dense in at least the lowermost layer which contacts the substrate section. The thickness of the electrode film is preferably small so as to secure a displacement amount. The thickness is designed to be usually 15 µm or less, more preferably 5 µm or less.

The thickness per layer of the piezoelectric/electrostrictive film of the operation section is preferably small so that large displacement can be obtained at a lower voltage, and is designed to be 100 µm or less. More preferably, the thickness is about 3 to 30 µm. When a plurality of piezoelectric/electrostrictive films are laminated in the operation section of the piezoelectric/electrostrictive device made of piezoelectric/electrostrictive film, the thickness is preferably gradually reduced. For example, a thickness $t_n$ of an n-th piezoelectric/electrostrictive film from below is preferably formed to satisfy the following: $t_n \leq t_{n-1} \times 0.95$. This is because a strain amount of the piezoelectric/electrostrictive film increases with a higher applied electric field, that is, with a smaller thickness of the piezoelectric/electrostrictive film at the same driving voltage. Therefore, when the piezoelectric/electrostrictive film formed in an upper part is reduced, and when the film is constituted so as to be distorted more largely than the piezoelectric/electrostrictive film formed in a lower part, it is possible to raise bending efficiency and to more effectively develop bending displacement.

The operation section includes two to four layers of the piezoelectric/electrostrictive films in a preferred mode. The thickness per layer of the piezoelectric/electrostrictive film is reduced, for example, to 30 µm or less, two to four layers of the films are laminated, and it is accordingly possible to obtain the operation section which is thicker and has a higher aspect ratio. In comparison of the operation section with an operation section having the same thickness per layer of the piezoelectric/electrostrictive film and including only one layer of the piezoelectric/electrostrictive film, high rigidity is obtained in a portion which is flexurally displaced, and therefore a response speed is higher. Since displacement is caused in a plurality of piezoelectric/electrostrictive films, a large generation force is entirely obtained. Although the rigidity is high, a relatively large displacement is obtained. Furthermore, in comparison with an operation section having the same total thickness of the operation section and having a large thickness per layer and including only one layer of the piezoelectric/electrostrictive film, an electric field intensity in the same driving voltage is higher, and it is possible to obtain a relatively large displacement and generation force.

It is to be noted that in the piezoelectric/electrostrictive device made of piezoelectric/electrostrictive film according to the present invention, the piezoelectric/electrostrictive film constituting the operation section can change in accordance with use. However, when the film is generally used as the actuator, for the characteristic, the film having a piezoelectric constant $|d_{31}|$ of $50 \times 10^{-12}$ m/V or more is preferably used. More preferably, the film has $|d_{31}|$ of $100 \times 10^{-12}$ m/V or more. The piezoelectric/electrostrictive film is referred to, but the material for use as the piezoelectric/electrostrictive film in the present specification is not limited to a material which develops a piezoelectric effect for generating a strain amount approximately proportional to the applied electric field, or an electrostrictive effect for generating the strain amount approximately proportional to square of the applied electric field in a narrow sense. Materials which develop phenomena such as polarization reversal seen in general ferroelectric materials, and antiferroelectric phase-ferroelectric phase transition seen in antiferroelectric materials are included. The material is not limited by whether or not a polarization process is necessary.

Next, the piezoelectric/electrostrictive device made of piezoelectric/electrostrictive film according to the present invention will more concretely be described hereinafter appropriately with reference to the drawings. First, embodiments will be described.

Figure 2:
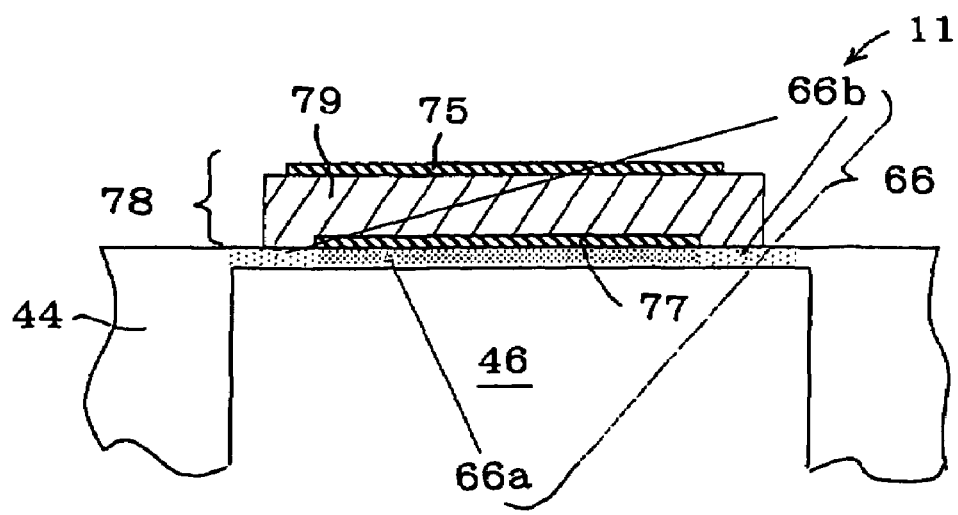
FIG. 2 is a sectional view showing one embodiment of the piezoelectric/electrostrictive devices made of piezoelectric/electrostrictive film according to the present invention.
Figure 5:
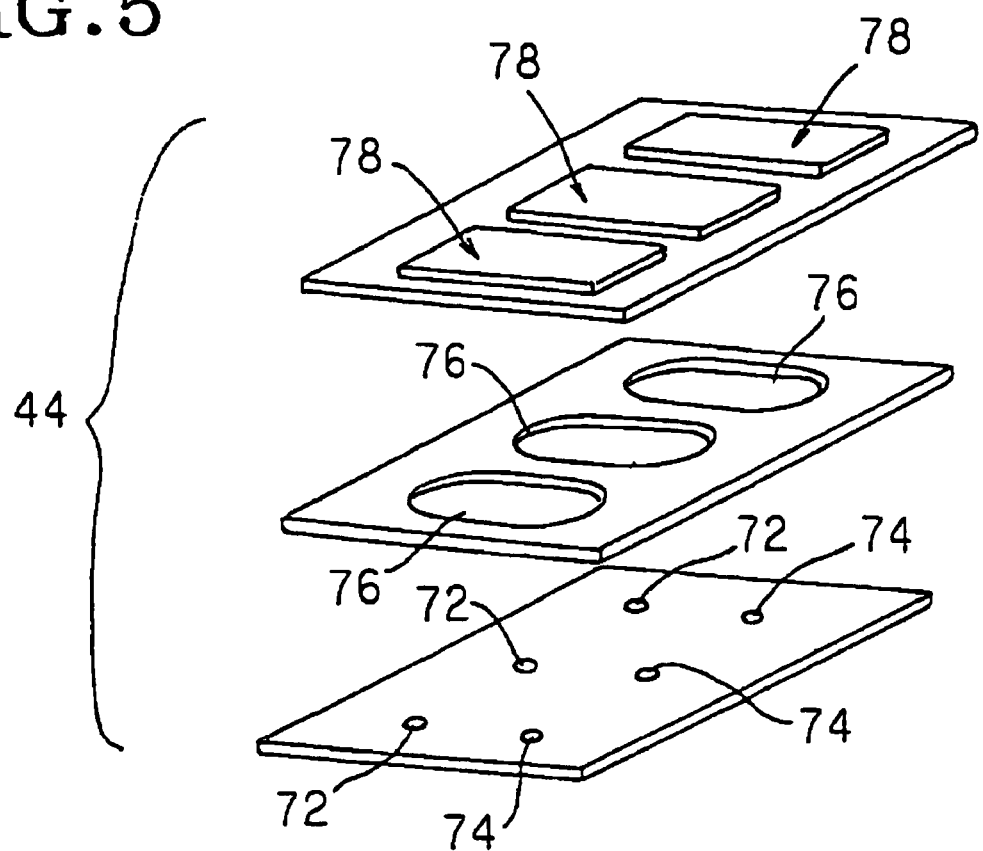
FIG. 5 is an exploded perspective view showing a structure of the piezoelectric/electrostrictive devices made of piezoelectric/electrostrictive film according to the present invention.

FIGS. 1 and 2 are sectional views showing one example of the embodiment of the piezoelectric/electrostrictive device made of piezoelectric/electrostrictive film according to the present invention. FIG. 5 is an explanatory view of a structure of the piezoelectric/electrostrictive device made of piezoelectric/electrostrictive film according to the present invention, and is an exploded perspective view showing that one substrate section includes a plurality of operation sections and that the substrate section includes a laminated structure.

A piezoelectric/electrostrictive device 11 made of piezoelectric/electrostrictive film shown in FIG. 1 is constituted of a substrate section 44 formed of a ceramic, and an operation section 78 formed integrally with the substrate section 44. The substrate section 44 is not limited, but preferably includes a structure in which a plurality of ceramic plates having thin flat plate shapes are laminated, because yield is improved as follows (see FIG. 5). A green sheet which is fired to form the substrate section has flexibility and is therefore originally difficult to handle. For example, unless a support method is carefully carried out at a carrying-in time into a firing furnace, there is a problem that the sheet is distorted or broken because of its own weight or easily deformed after fired. For the structure in which a plurality of ceramic plates are laminated, the rigidity is further improved, and it is therefore possible to inhibit defective products caused by the handling from being produced.

In the substrate section 44, a cavity 46 connected to the outside through holes for communication 72, 74 shown in FIG. 1 is formed. The cavity 46 can be obtained, when a ceramic plate including openings 76 formed to have substantially rectangular horizontal sectional shapes is superposed upon other ceramic plates including a ceramic plate having the holes for communication 72, 74, for example, as shown in FIG. 5.

As shown in FIG. 1, the piezoelectric/electrostrictive device 11 made of piezoelectric/electrostrictive film includes the operation section 78 in an outer surface opposite to a surface in which the holes for communication 72, 74 of the substrate section 44 are formed and in a position opposite to the cavity 46 formed in the substrate section 44. The operation section 78 is constituted of a lower electrode film 77, piezoelectric/electrostrictive film 79, and upper electrode film 75 in order from below in the diagram, and is formed by a film forming method.

In the piezoelectric/electrostrictive device 11 made of piezoelectric/electrostrictive film including this structure, electricity is supplied between the lower electrode film 77 and the upper electrode film 75, an electric field function is produced in the piezoelectric/electrostrictive film 79, an electric field induced strain of the piezoelectric/electrostrictive film 79 is induced based on the electric field, and the bending displacement or generation force in a vertical direction is developed in the substrate section 44 by a transverse effect.

As shown in FIG. 2, the piezoelectric/electrostrictive device 11 made of piezoelectric/electrostrictive film includes a diaphragm plate 66 which is a part of the substrate section 44. For the diaphragm plate 66, the operation section 78 is disposed in one surface and the other surface is disposed opposite to the cavity 46. Since the plate is thin, the plate is easily inflected with the strain generated in the operation section 78. This diaphragm plate 66 is constituted of a ceramics containing 0.3 to 4% by mass of a titanium element in an equivalent amount of titanium oxide, and includes a projected section 66a projected by the lower electrode film 77 and a non-projected section 66b, and the projected section 66a contains more titanium elements than the non-projected section 66b. This will concretely be described. The projected section 66a can contain 2.5% by mass of the titanium element in the titanium oxide equivalent amount, and the non-projected section 66b can contain 0.4% by mass of the titanium element in the titanium oxide equivalent amount. It is to be noted that in the substrate section 44, the ceramics constituting a part other than the diaphragm plate 66 may or may not contain the titanium element, and is not limited.

Since the diaphragm plate 66 of the substrate section 44 is constituted of the ceramics containing the titanium element in the piezoelectric/electrostrictive device 11 made of piezoelectric/electrostrictive film, the stress remaining in the piezoelectric/electrostrictive film can be reduced regardless of the design as described above. Therefore, a firing condition is stabilized, original characteristics of the piezoelectric/electrostrictive material are developed, and it is possible to obtain large displacement even in a higher integrated state. In mass production, a fluctuation of displacement characteristics is smaller. The thickness of the diaphragm plate 66 is preferably 50 μm or less, more preferably 20 μm or less, further preferably about 2 to 10 μm. Similarly, as described above, with the thickness, the titanium element is easily diffusing uniformly in a thickness direction of the diaphragm plate 66, and the effect of the titanium element can more effectively be used.

The content of the titanium element of the substrate section constituted of the ceramics can be determined using intensity of a characteristic X ray of the titanium element by an electron probe micro analyzer (EPMA) method. Concrete means are as follows. First, the prepared piezoelectric/electrostrictive device made of piezoelectric/electrostrictive film is cut and polished in mirror surfaces, and a section is obtained as shown in FIG. 1. Moreover, on conditions that an acceleration voltage of an electron beam is 15 kV and an irradiation current is 50 nA, the substrate section is irradiated with the electron beam, and in contrast of the obtained intensity of the characteristic X ray of the titanium element with an calibration curve prepared beforehand, the amount of the titanium element existing in the substrate section is obtained. The measurement is carried out in five points at random on a specimen, and an average is obtained as a quantitative result.

Figure 3:
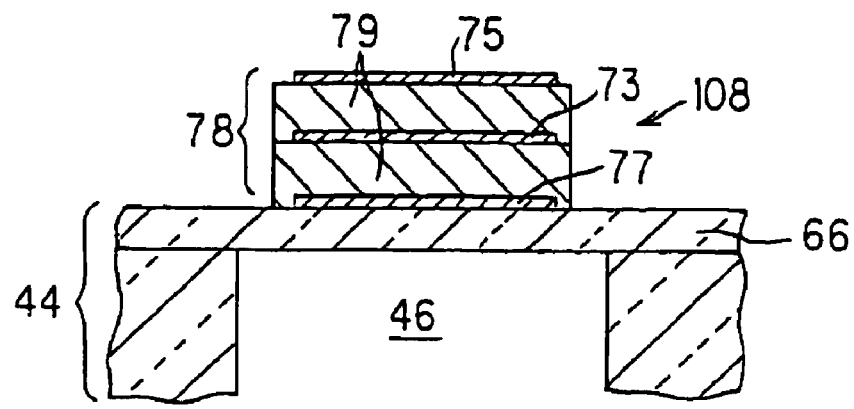
FIG. 3 is a sectional view showing another embodiment of the piezoelectric/electrostrictive devices made of piezoelectric/electrostrictive film according to the present invention.

Next, this will be described with reference to FIG. 3. FIG. 3 is a diagram showing another embodiment of the piezoelectric/electrostrictive device made of piezoelectric/electrostrictive film according to the present invention, and is a sectional view seen from a short-side direction of the piezoelectric/electrostrictive film. A piezoelectric/electrostrictive device 108 made of piezoelectric/electrostrictive film shown in FIG. 3 is a piezoelectric/electrostrictive device made of piezoelectric/electrostrictive film of a typical type in which the width of the lower electrode film 77 and piezoelectric/electrostrictive film 79 is smaller than that of the cavity 46 by 10% or more.

In the piezoelectric/electrostrictive device 108 made of piezoelectric/electrostrictive film, the operation section 78 includes two layers of the piezoelectric/electrostrictive films 79 and five layers in total are laminated. Even when the total thickness of the operation section is the same, the thickness of one layer of the piezoelectric/electrostrictive film can further be reduced, the electric field intensity becomes higher even with the same driving voltage, and a relatively large displacement and generation force can be obtained. When the thickness per layer of the piezoelectric/electrostrictive film is reduced, firing shrinkage is restricted by the substrate section or the electrode film, and firing stress easily remains. However, since the restriction is further reduced in the piezoelectric/electrostrictive device 108 made of piezoelectric/electrostrictive film, a desired characteristic can be realized.

For the piezoelectric/electrostrictive device 108 made of piezoelectric/electrostrictive film, the number of laminates of the piezoelectric/electrostrictive film 79 is two. Therefore, it is easier to form the operation section having a high ratio of a height (usually a vertical direction length) to a width (usually a horizontal direction length), a so-called high aspect ratio as in the piezoelectric/electrostrictive device 11 made of piezoelectric/electrostrictive film described above as compared with the device including one layer of the piezoelectric/electrostrictive film. Since the operation section having the high aspect ratio can obtain the high rigidity in the bending displaced portion, a higher response speed can be obtained. Additionally, since the displacement is caused in a plurality of piezoelectric/electrostrictive films, the large generation force is entirely obtained. Even with the high rigidity, it is possible to obtain a relatively large displacement. It is to be noted that although not shown, in the piezoelectric/electrostrictive device 108 made of piezoelectric/electrostrictive film, the diaphragm plate 66 contains 0.3 to 4% by mass of the titanium element in the titanium oxide equivalent amount in the same manner as in the piezoelectric/electrostrictive device 11 made of piezoelectric/electrostrictive film. Moreover, the diaphragm plate 66 includes the projected section projected by the lower electrode film 77 and the non-projected section, and the projected section contains more titanium elements than the non-projected section.

Figure 4:
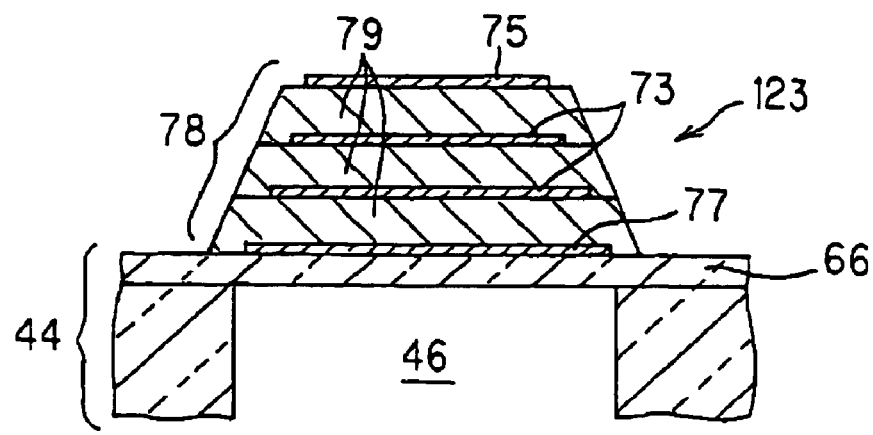
FIG. 4 is a sectional view showing still another embodiment of the piezoelectric/electrostrictive devices made of piezoelectric/electrostrictive film according to the present invention.

Next, a piezoelectric/electrostrictive device 123 made of piezoelectric/electrostrictive film shown in FIG. 4 is a piezoelectric/electrostrictive device made of piezoelectric/electrostrictive film in which the piezoelectric/electrostrictive films 79 are stacked in a trapezoidal shape and the width of the electrode film is narrowed toward the upper part. In this type, since a margin of alignment can be taken, there is a merit that a multilayered structure can relatively easily be prepared. The piezoelectric/electrostrictive device 123 made of piezoelectric/electrostrictive film includes three layers of the piezoelectric/electrostrictive films to which one layer is added as compared with the above-described piezoelectric/electrostrictive device 108 made of piezoelectric/electrostrictive film in which the operation section 78 includes two layers of the piezoelectric/electrostrictive films 79. It is to be noted that the device is further suitable for obtaining the large generation force and displacement. The device has a characteristic related to the titanium element content in the same manner as the above-described piezoelectric/electrostrictive device made of piezoelectric/electrostrictive film.

In the piezoelectric/electrostrictive devices 108, and 123 made of piezoelectric/electrostrictive film shown in FIGS. 3, 4, a plurality of thin ceramic plates may be laminated in the substrate section 44, and one ceramic plate having a predetermined thickness may be processed to dispose the cavity 46. One or two or more operation sections 78 can be arranged on the substrate section 44.

The embodiments of the piezoelectric/electrostrictive device made of piezoelectric/electrostrictive film according to the present invention have been described above with reference to the drawings, but the piezoelectric/electrostrictive device made of piezoelectric/electrostrictive film according to the present invention is not limited by presence/absence of the cavity. The shape or arrangement of the constituting element is not especially limited. Each film constituting the operation section may have any shape or arrangement in accordance with the use. The shape may include not only polygonal shapes such as triangular and quadrangular shapes and round shapes such as circular and elliptical shapes but also special shapes such as a grid shape. The shape of the substrate section is not especially limited to the rectangular shape, and the circular shape or the polygonal shape other than the quadrangular shape, such as the triangular shape, may also be used. As in the above-described piezoelectric/electrostrictive devices 108, and 123 made of piezoelectric/electrostrictive film, with the use of the type in which the operation section is disposed on an outer surface side of the substrate section, it is easier to prepare the device. This is preferable in that the pressure inside the cavity can be more largely changed, but this is not necessarily limited. The operation section may be formed on a cavity inner surface side in the substrate section or on the opposite sides.

One example of the preferred type of the piezoelectric/electrostrictive devices made of piezoelectric/electrostrictive film according to the present invention will be described. A plurality of operation sections substantially having the same rectangular shape form pairs with the cavities disposed in the same substrate section, and are arranged at constant intervals in the same direction on the same substrate section. Moreover, depending on the use, integration density of the arrangement is desired to be high. For example, when the device is used as the actuator of the print head of the ink jet printer, a shortest distance of the interval between the piezoelectric/electrostrictive devices made of piezoelectric/electrostrictive film disposed adjacent to each other is desired to be 1000 μm or less, and the pitch is more preferably 500 μm or less. With this highly integrated arrangement, the piezoelectric/electrostrictive device made of piezoelectric/electrostrictive film is necessarily reduced. The characteristic deterioration of the piezoelectric/electrostrictive film by the firing stress at the time of the heat treatment integration of the ceramic substrate section with the piezoelectric operation section has heretofore been a problem. However, in the piezoelectric/electrostrictive device made of piezoelectric/electrostrictive film according to the present invention, since the firing stress is reduced, the displacement characteristic is obtained in accordance with the device design taking advantage of the material characteristic, and it is possible to secure a sufficient displacement in the ink jet without any hindrance.

Next, the materials of the respective elements constituting the piezoelectric/electrostrictive device made of piezoelectric/electrostrictive film according to the present invention will individually/concretely be described. First, the substrate section constituted of the ceramics containing the titanium element will be described.

As the material constituting the substrate section, among the ceramics, for example, zirconium oxide, aluminum oxide, magnesium oxide, aluminum nitride, and silicon nitride can preferably be used. More preferable material is zirconium oxide. For zirconium oxide, a material containing fully stabilized zirconium oxide as a major component or a material containing partially stabilized zirconium oxide as a major component is most preferably used because the mechanical strength is large even with the small thickness, the toughness is high, and the reactivity with the material of the piezoelectric/electrostrictive film or the electrode film is small.

Fully stabilized zirconium oxide and partially stabilized zirconium oxide are preferably subjected to a stabilizing as follows. That is, examples of a compound for stabilizing zirconium oxide include yttrium oxide, ytterbium oxide, cerium oxide, calcium oxide, and magnesium oxide. When at least one of the compounds is added or contained, zirconium oxide is partially or fully stabilized. For the stabilization, a targeted stabilization of zirconium oxide is possible not only by addition of one compound but also by addition of a combination of the compounds.

An addition amount of each compound is desirably 1 to 30 mol %, preferably 1.5 to 10 mol % with yttrium oxide or ytterbium oxide, 6 to 50 mol %, preferably 8 to 20 mol % with cerium oxide, and 5 to 40 mol %, preferably 5 to 20 mol % with calcium oxide or magnesium oxide. Above all, especially yttrium oxide is preferably used as a stabilizer. In this case, the amount is preferably 1.5 to 10 mol %, further preferably 2 to 4 mol %. As additives such as a sintering aid, alumina, silica, transition metal oxide, and the like are preferably added in a range of 0.05 to 20 wt %.

In order to obtain the above-described mechanical strength and stabilized crystal phase, an average crystal grain size of zirconium oxide is desirably set to 0.05 to 3 µm, preferably 1 µm or less. As described above, for the substrate section, various ceramics other than zirconium oxide can also be used. When the structure of the substrate section is constituted of a plurality of layers of ceramic plates, and includes the cavity, preferably substantially the same material is preferably used to constitute members, because reliability of joined portions, strength of the device, and reduced manufacturing intricacy can be achieved.

In order to diffuse the titanium element in at least a portion functioning as the diaphragm plate, for the ceramic material constituting the substrate section, a material to which 0.3 to 4.0% by mass, more preferably 0.4 to 2.5% by mass of titanium oxide is added is preferably used. A titanium oxide material to be added, having a median diameter of 0.05 to 0.4 µm or a specific surface area as BET Value of 5 to 8 m²/g, is preferably used. With the use of this raw material, the titanium element can exist uniformly in the substrate section (diaphragm plate). It is to be noted that a source of the titanium element may also be an organic titanium compound such as titanium resinate.

Next, the operation section will be described. The material of the piezoelectric/electrostrictive film constituting the operation section is not limited as long as the material causes the electric field induced strain such as a piezoelectric or electrostrictive effect. The material may be either crystalline or amorphous, and it is also possible to use a semiconductor, ceramics, ferroelectric ceramics, or an antiferroelectric ceramics. The material may appropriately be selected and used in accordance with the use.

Examples of the concrete material include a ceramics containing lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, strontium bismuth tantalite, and the like alone or a mixture thereof. Especially, because the material has high electromechanical coupling factor and piezoelectric constant, reactivity with the substrate section constituted of the ceramics is small during firing of the piezoelectric/electrostrictive film, and a stable composition is obtained, a material containing lead zirconate titanate (PZT-system) and lead magnesium niobate (PMN-system) as the major components, or sodium bismuth titanate as the major component is preferably used. Furthermore, a material which contains a three-components solid solution of lead titanate, lead zirconate, and lead magnesium niobate as the major component and to which nickel oxide and silicon oxide are added is preferably used.

Furthermore, a ceramics may also be used which is obtained by adding lanthanum, calcium, strontium, molybdenum, tungsten, barium, niobium, zinc, nickel, manganese, cerium, cadmium, chromium, cobalt, antimony, iron, yttrium, tantalum, lithium, bismuth, tin, and the like alone or as a mixture to the above-described material. For example, when lanthanum or strontium is contained in lead zirconate, lead titanate, and lead magnesium niobate as the major component, advantages that cohesive electric field and piezoelectric characteristic can be adjusted are sometimes obtained.

The material of the electrode film of the operation section is preferably constituted of a metal which is solid at room temperature and which can bear high-temperature oxidizing atmosphere having approximately a firing temperature shown in a manufacturing process described later and which is superior in conductivity. For example, aluminum, titanium, chromium, iron, cobalt, nickel, copper, zinc, niobium, molybdenum, ruthenium, palladium, rhodium, silver, tin, tantalum, tungsten, iridium, platinum, gold, lead, and another single metal or an alloy of these is used. Furthermore, a cermet material may also be used in which the same material as that of the piezoelectric/electrostrictive layer or the substrate section described above is dispersed. Platium is a more preferable material.

To contain the titanium element in the substrate section, as the material of at least the lowermost layer electrode, a material is used to which 0.1 to 10.0% by mass, more preferably 0.3 to 8.0% by mass of titanium oxide is added. By the heat treatment of the electrode constituted of this material, the titanium element is diffused on the substrate section side, and the titanium element can exist in the substrate section (diaphragm plate). For the titanium oxide material to be added, a raw material having a median diameter of 0.05 to 0.4 µm or a specific surface area as BET Value of 5 to 8 m²/g is preferably used. Titanium oxide can uniformly be mixed with the electrode material, and it is possible to form the electrode without largely influencing the film quality or conductivity of the conductor film or strength required for the bonding integration with the substrate section. Moreover, for the material of the lowermost layer electrode, a dense material is preferably used. This is by a situation in which the electric field induced strain of the piezoelectric/electrostrictive material can efficiently be converted to the bending displacement.

Additionally, the selection of the material of the electrode film in the operation section depends on a method of forming the piezoelectric/electrostrictive film. For example, in the piezoelectric/electrostrictive device 108 made of piezoelectric/electrostrictive film according to the present invention shown in FIG. 3, after forming the lower electrode film 77 on the substrate section 44 constituted of the ceramics, the piezoelectric/electrostrictive film 79 is fired and accordingly formed on the electrode film 77. In this case, in the electrode film 77, it is necessary to use high-melting point metals such as platinum which does not change even at a firing temperature of the piezoelectric/electrostrictive film 79. This also applies to an intermediate electrode film 73. However, after forming the piezoelectric/electrostrictive film 79, it is possible to form the electrode film in the upper electrode film 75 formed on the piezoelectric/electrostrictive film 79 at a low temperature, and therefore low-melting point metals such as aluminum, gold, and silver can also be used. The thickness of the electrode film can be a factor considerably for lowering the displacement of the operation section. Therefore, especially when the electrode is formed after firing the piezoelectric/electrostrictive film, organic metal pastes for obtaining a dense and thinner fired film, such as a gold resinate paste, platinum resinate paste, and silver resinate paste, are preferably used in the upper electrode film 75 and intermediate electrode film 73.

Subsequently, first and second manufacturing methods of the piezoelectric/electrostrictive device made of piezoelectric/electrostrictive film according to the present invention will be described. The manufacturing method of the piezoelectric/electrostrictive device made of piezoelectric/electrostrictive film according to the present invention is a manufacturing method of the piezoelectric/electrostrictive device made of piezoelectric/electrostrictive film which comprises: the substrate section; and the operation section disposed on the substrate section and constituted of the piezoelectric/electrostrictive film and electrode film and in which the operation section includes the piezoelectric/electrostrictive films and electrode films alternately laminated so that uppermost and lowermost layers form the electrode films and in which the operation and substrate sections are integrally fired and in which the substrate section is constituted of the ceramics containing the titanium element. By a difference of means for constituting the substrate section of the ceramics containing the titanium element, there are two methods including a method (first manufacturing method) of using a conductor material containing 0.3 to 8% by mass of titanium oxide as the material of the electrode film of the lowermost layer contacting the substrate section to contain the titanium element in the substrate section by the heat treatment, and a method (second manufacturing method) of using the material containing titanium oxide beforehand as the ceramic material constituting the substrate section.

To prepare the piezoelectric/electrostrictive device made of piezoelectric/electrostrictive film according to the present invention, either or both of the two methods may be used. The methods are both used, that is, the material containing titanium oxide beforehand is used as the ceramic material constituting the substrate section, while the conductor material containing 0.3 to 8% by mass of titanium oxide is used as the material of the electrode film of the lowermost layer contacting the substrate section to contain the titanium element in the substrate section by the heat treatment.

The process of preparing the piezoelectric/electrostrictive device made of piezoelectric/electrostrictive film according to the present invention will hereinafter concretely be described based on the first manufacturing method. First, the preparing process of the substrate section will be described. It is preferable to manufacture the device using a green sheet laminating method with respect to the substrate section constituted of the ceramics. In the piezoelectric/electrostrictive device made of piezoelectric/electrostrictive film according to the present invention, bonding reliability of the substrate section and operation section to be integrated is a very important point which influences the characteristics of the actuator. However, in the green sheet laminating method in which the substrate section can integrally be, a condition change of the joined portion of each member with an elapse of time is hardly caused. Therefore, the method is high in the reliability of the joined portion and easy in securing the rigidity. Moreover, since the green sheet laminating method is superior in productivity and formability, it is possible to prepare the actuator having a predetermined shape in a short time with good reproducibility.

The preparing process of the substrate section by the green sheet laminating method is, for example, as follows. First, a binder, solvent, dispersant, plasticizer, and the like are added to/mixed with ceramic powders such as zirconium oxide to prepare slurry. After a degassing treatment, a green sheet having a predetermined thickness is prepared by methods such as a reverse roll coater method and doctor blade method.

Next, the green sheet is processed in various requested shapes by methods such as punching using a die and laser processing. For example, when the piezoelectric/electrostrictive device made of piezoelectric/electrostrictive film shown in FIG. 5 is prepared, one green sheet (referred to as the green sheet A) forming a ceramic plate in which the operation section 78 is directly disposed later, one green sheet (referred to as the green sheet B) forming the ceramic plate in which at least one rectangular opening 76 is formed and which is fired, and one green sheet (referred to as the green sheet C) forming the ceramic plate in which at least one each of the holes for communication 72, 74 is formed and which is fired are processed and prepared. The shapes of the openings 76 do not have to be all the same, and can be determined in accordance with desired functions. As long as the holes for communication 72, 74 are connected to an outside space, the shapes of the holes for communication 72, 74 are not especially limited. For example, with the use as the actuator of the printer head of the ink jet printer, as shown in FIG. 5, a hole having a substantially circular opening section is formed for each of the holes for communication 72, 74 individually connected to the outside space. When the openings 76 are juxtaposed and formed in the green sheet B, it is possible to obtain a plurality of piezoelectric/electrostrictive devices made of piezoelectric/electrostrictive film at once.

A sequence for laminating the green sheets A, B, C is not especially limited, and the sheets can be laminated in an arbitrary order. For example, a method of successively stacking the green sheets A, B, C and subsequently obtaining a ceramic green laminate by compressing may be used. Alternatively, a method of stacking the green sheets A, B to obtain an integrated material by the compressing and thereafter superposing the green sheet C onto the integrated material to obtain the ceramic green laminate by the compressing may also be used.

When heat is applied while compressing the green sheets onto one another, a laminating condition can be improved. Alternatively, when the paste, slurry, and the like mainly containing the ceramic powder and binder is applied and printed onto the green sheet to form a bonding aid layer, the laminating condition can be improved. For the ceramic powder for use at this time, it is preferable to use the same composition as that of the ceramics used in the green sheet or the similar composition in securing the reliability.

The number of green sheets A, B, C is not limited, and at least one each of the green sheets A, C and at least one green sheet B in which at least one opening is formed can be used to prepare the ceramic green laminate. It is to be noted that the above-described green sheet laminating method is simply illustrated and all methods are not described. For example, even when the number of lamination is four or more, the number and sequence of compressing are not especially limited, and the method of preparing the ceramic green laminate is not limited to these.

When the ceramic green laminate is obtained, the laminate is fired to form a ceramic laminate. The ceramic green laminate is fired at a temperature of about 1200 to 1600° C., but the ceramic laminate obtained by the firing sometimes has an unintended warp. In this case, it is preferable to lay a weight, re-fire the laminate (hereinafter referred to also as warp correction) at a temperature close to the firing temperature, and flat the laminate. As the weight, a flat and porous ceramic plate made of alumina is preferably used. Moreover, the warp correction may be carried out successively after the firing. Additionally, a method of laying the weight beforehand at the firing time and flatting the laminate simultaneously with the firing can also be used.

Instead of firing only the ceramic green laminate, a procedure of forming the operation section on the ceramic green laminate by a film forming method described later and subsequently firing the laminate may also be used. However, a procedure of sintering the ceramic laminate before forming the operation section is more preferable, because dimensional precision becomes higher and the warp of the operation section can be suppressed.

The preparing process of the substrate section by the green sheet laminating method has been described above, but in addition to a manufacturing method using the green sheet in preparing the substrate section, a pressurizing molding method or cast molding method using a mold, injection molding method, photolithography, and the like can also be used to prepare the section.

Next, the preparing process of the operation section will be described. The operation section is preferably manufactured using a thin or thick film forming method. Without using any adhesive, the operation section can integrally be bonded to the substrate section, the reliability and reproducibility are improved, and the integration is facilitated.

The piezoelectric/electrostrictive film and electrode film constituting the operation section can be formed in the surface of the ceramic laminate by: the thick-film forming methods such as a screen printing method, dipping method, coating method, and electrophoresis method; or the thin-film forming methods such as an ion beam method, sputtering method, vacuum evaporation method, ion plating method, chemical vapor deposition method (CVD), and plating. Moreover, the above-described film forming methods are preferably carried out a plurality of times, instead of carrying out the method only once per layer.

It is more preferable to form the piezoelectric/electrostrictive film by the thick-film forming method. The paste, slurry, suspension, emulsion, sol, and the like containing a piezoelectric/electrostrictive material (ceramic particles) having an average particle size of 0.01 to 5 µm, preferably 0.05 to 3 µm as the major component can be used to form the piezoelectric/electrostrictive film, and a satisfactory operation characteristic can be obtained. The average size of crystal grains of the fired piezoelectric/electrostrictive film is preferably 1 to 7 µm. This is because the high piezoelectric characteristic can be obtained.

Among the thick-film forming methods, especially the electrophoresis method has an advantage that the film can be formed with high density and high shape precision, and is preferable for forming the piezoelectric/electrostrictive film. On the other hand, the screen print method is preferably used as the manufacturing method of the present invention, because the film formation and pattern formation can simultaneously be carried out. For example, as means for forming the piezoelectric/electrostrictive film of the operation section, a method of first using the screen print method and using the electrophoresis method second and subsequent times is also preferably used.

More concretely, the preparing process of the operation section will be described in terms of an example of the piezoelectric/electrostrictive device 108 made of piezoelectric/electrostrictive film according to the present invention shown in FIG. 3. First, the ceramic green laminate forming the substrate section 44 later is fired on a predetermined condition (at a temperature of preferably 1200° C. to 1600° C.). Thereafter, the lower electrode film 77 is printed in a predetermined position of the surface of the obtained ceramic laminate, and fired on the predetermined condition (at a temperature of preferably 1200° C. to 1450° C.) . Since the lower electrode film 77 is the electrode film of the lowermost layer of the operation section in contact with the substrate section, in the first manufacturing method, the conductor material containing 0.3 to 8% by mass of titanium oxide is used as the material of the electrode film. The titanium element of titanium oxide is diffused on the substrate section side by the firing (heat treatment), so that the substrate section contains the titanium element.

Next, the piezoelectric/electrostrictive film 79 is printed, and the intermediate electrode film 73 is printed and fired on the predetermined condition (at a temperature lower than the firing temperature of the piezoelectric/electrostrictive film 79 to be printed next by preferably 0° C. to 300° C.). Furthermore, the piezoelectric/electrostrictive film 79 is printed and fired on the predetermined condition (at a temperature of preferably 1100° C. to 1350° C.), the upper electrode film 75 is printed and fired on the predetermined condition (at a temperature of preferably 500° C. to 900° C.), and the operation section 78 can be formed. Thereafter, an electrode lead (not shown) for connecting the electrode film to a driving circuit may be printed and fired.

It is to be noted that a process of repeating the first printing of the (lower) piezoelectric/electrostrictive film 79, the printing of the intermediate electrode film 73, and the firing is carried out m times, and accordingly it is possible to form the piezoelectric/electrostrictive device made of piezoelectric/electrostrictive film which includes m+1 layers of the piezoelectric/electrostrictive films 79. In contrast, the piezoelectric/electrostrictive device 108 made of piezoelectric/electrostrictive film of FIG. 3 includes two layers of the piezoelectric/electrostrictive films 79. At this time, after finishing the repeating process, a firing temperature Tm1 after the printing of the intermediate electrode film 73 is preferably lower than a firing temperature Tm2 of the piezoelectric/electrostrictive film 79 to be formed (in the upper part) later by 0° C. to 300° C.

Here, the piezoelectric/electrostrictive film 79 finally formed (in the upper part) is fired only once at the firing temperature Tm2. On the other hand, the piezoelectric/electrostrictive film 79 formed in the middle is fired at the firing temperature Tm1 several times and thereafter fired at the firing temperature Tm2 once. Therefore, when the firing temperature Tm1 is set to be lower than the firing temperature Tm2, it is possible to uniform a firing condition of each piezoelectric/electrostrictive film.

Figure 6:
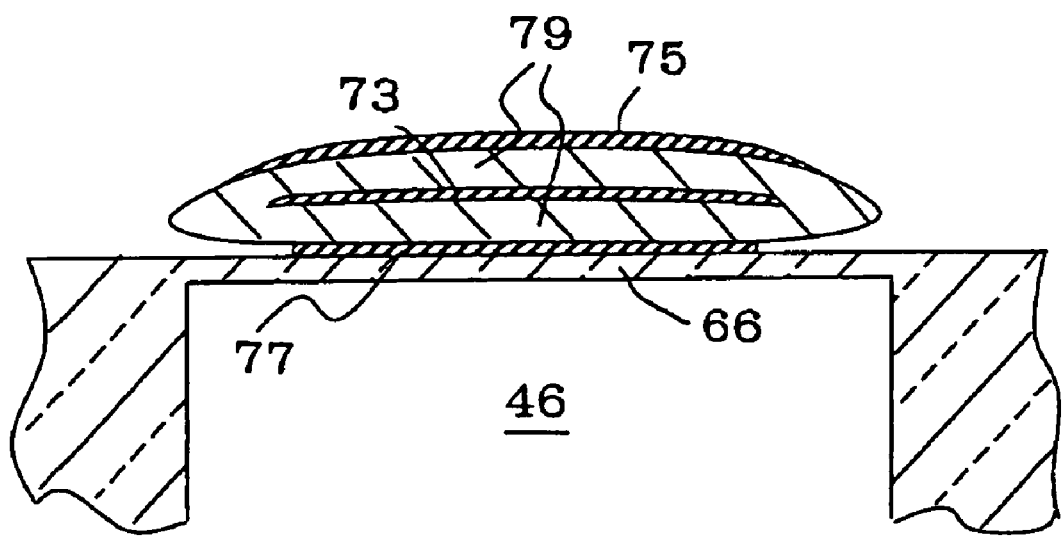
FIG. 6 is a diagram showing one embodiment of the piezoelectric/electrostrictive devices made of piezoelectric/electrostrictive film according to the present invention, and is a sectional view showing one actual shape example of the embodiment corresponding to that of FIG. 3.
Figure 7:
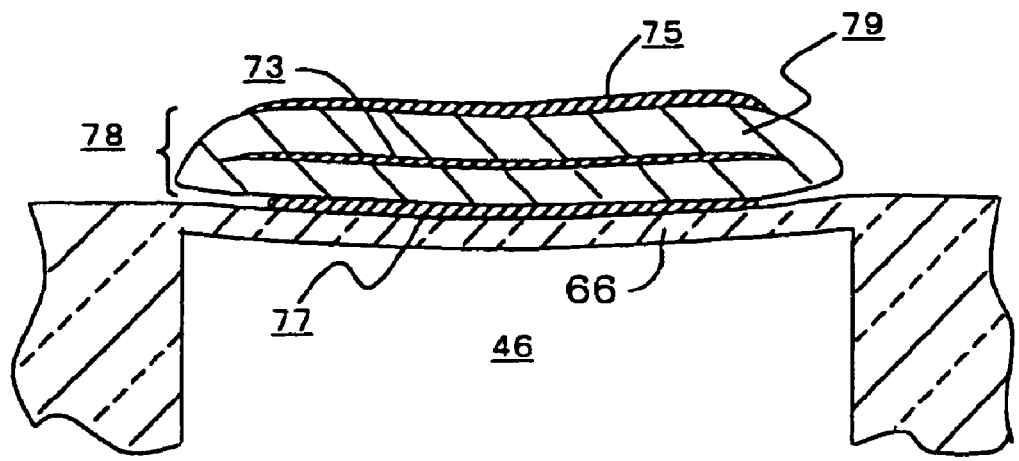
FIG. 7 is a diagram showing one embodiment of the piezoelectric/electrostrictive devices made of piezoelectric/electrostrictive film according to the present invention, and is a sectional view showing another actual shape example of the embodiment corresponding to that of FIG. 3.
Figure 8:
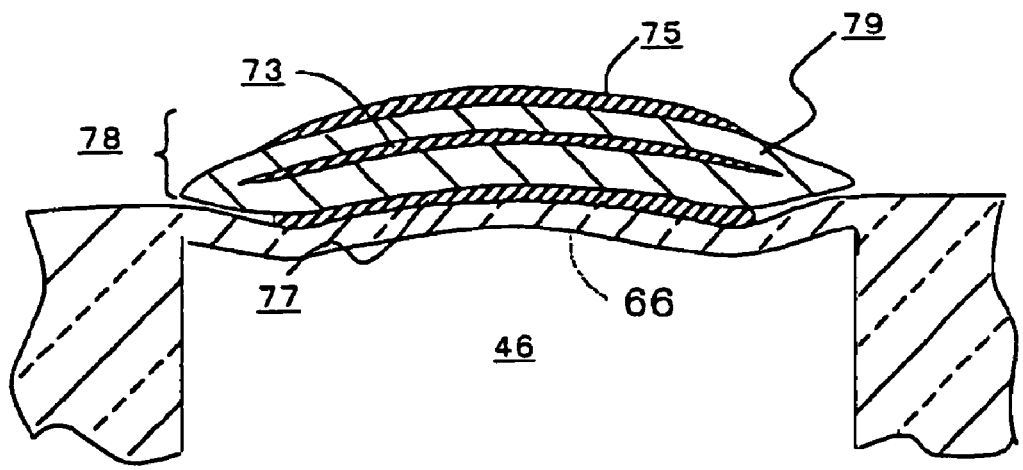
FIG. 8 is a diagram showing one embodiment of the piezoelectric/electrostrictive devices made of piezoelectric/electrostrictive film according to the present invention, and is a sectional view showing still another actual shape example of the embodiment corresponding to that of FIG. 3.
Figure 9:
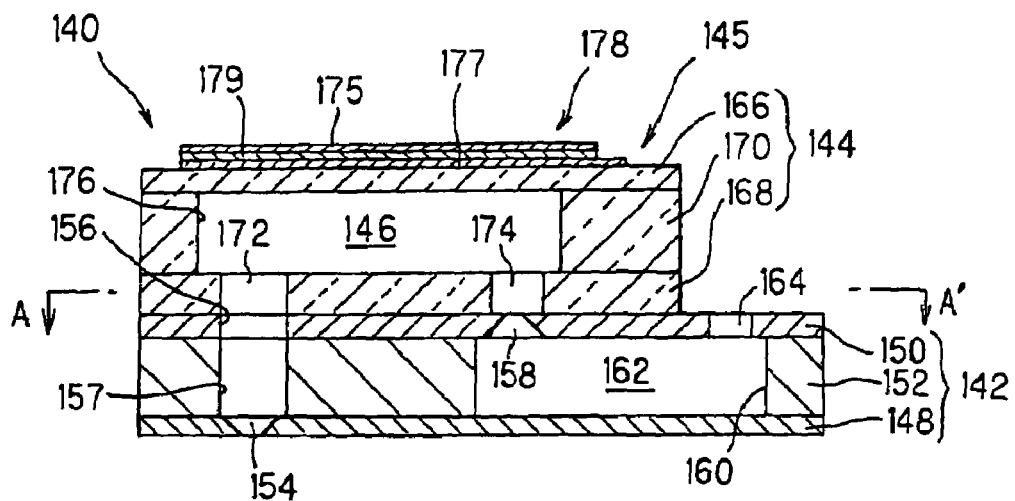
FIG. 9 is a sectional view showing another example of a conventional actuator.
Figure 10:
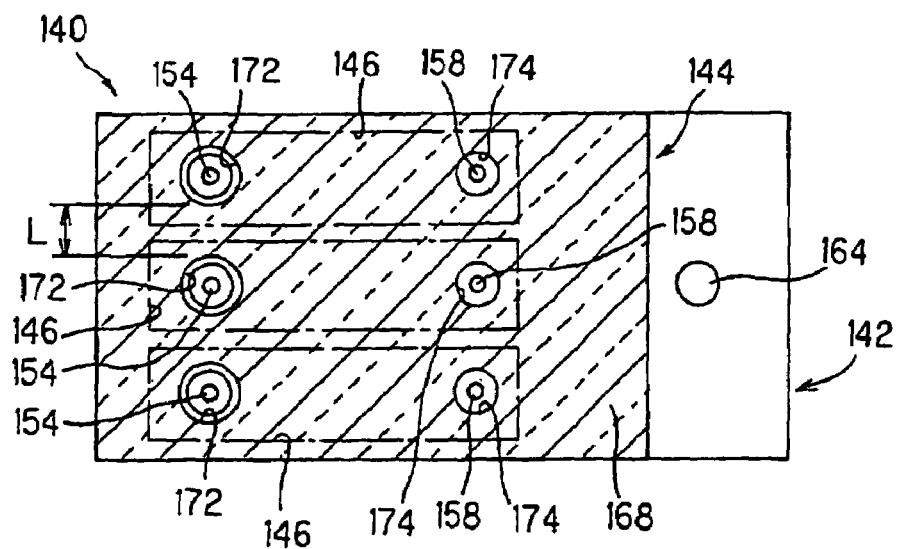
FIG. 10 is a diagram showing another example of the conventional actuator, and is an AA' sectional view of FIG. 9.

To form the piezoelectric/electrostrictive film, for example, when the screen print method is used to adjust fluidity of the paste of the piezoelectric/electrostrictive material, the film thickness can be reduced toward a pattern edge in a short-side direction (see FIG. 6). Moreover, in the firing process of the piezoelectric/electrostrictive film 79, the degree of shrinkage of the piezoelectric/electrostrictive film in the short-side direction is adjusted, and the middle portion of the diaphragm plate 66 can have a concave shape in the direction of the cavity 46 (see FIG. 7). Furthermore, when start timings of shrinking of firing and firing shrinkage amounts of upper and lower portions of the piezoelectric/electrostrictive film 79 are adjusted, the diaphragm plate 66 of the substrate section 44 can be formed in a W-shape (see FIG. 8). The shape of the diaphragm plate 66 shown in FIG. 8 easily develops the bending displacement as compared with a simple shape shown in FIG. 7. This is supposedly because the deformation of the piezoelectric/electrostrictive film at the time of the shrinking during firing is easily released and the remaining stress deteriorating the characteristics of the piezoelectric/electrostrictive material is reduced.

Moreover, when the piezoelectric/electrostrictive device made of piezoelectric/electrostrictive film having a small length of the piezoelectric/electrostrictive film in the short-side direction (generally 200 μm or less) is prepared, the electrode film is broadened toward the upper layer from the lower layer, and accordingly the piezoelectric/electrostrictive film formed in the upper part can be deformed more largely than the piezoelectric/electrostrictive film formed in the lower part. As a result, the bending efficiency is raised, and the bending displacement is effectively developed. The difference of the width of the electrode film (broadened amount) is preferably optimized in consideration of an electric field distribution. For example, the difference in the width between a certain electrode film and the lower electrode film is preferably about twice the film thickness of the piezoelectric/electrostrictive film in the lower or upper layer of the electrode film.

When the appropriate material is selected, the operation section may integrally be fired once after successively printing the electrode film, piezoelectric/electrostrictive film, and electrode lead. On the other hand, after forming the piezoelectric/electrostrictive film, each electrode can also be disposed at a low temperature. When the material is selected, the piezoelectric/electrostrictive film and/or the electrode film applied to the operation section may be fired desired times at arbitrary times between the forming of the first electrode film and the forming of the last electrode film regardless of the above-described example. In any method, the titanium element of titanium oxide contained in the electrode film of the lowermost layer of the operation section which contacts the substrate section is diffused on the substrate section side by the firing, and the substrate section can contain the titanium element.

As described above, it is also preferable to form the operation section beforehand in the ceramic green laminate and to simultaneously fire (co-fire) the ceramic green laminate and operation section. In the simultaneous firing, all the constituting films of the operation section may be objects, only the lower electrode and ceramic green laminate may simultaneously be fired, or other constituting films excluding the upper electrode and the ceramic green laminate may simultaneously be fired, and various other methods can be used. For example, the piezoelectric/electrostrictive film is molded by a press molding method using a mold or a tape forming method using a slurry material and laminated onto the ceramic green laminate by compressing with heat, and the operation section and ceramic green laminate can simultaneously be fired. In this method, it is necessary to form the electrode beforehand in the piezoelectric/electrostrictive film using the above-described film forming method. It is also possible to form the electrode and piezoelectric/electrostrictive film which are constituting layers of the operation section in the ceramic green laminate by the screen printing and to simultaneously fire the layers.

The firing temperature of the piezoelectric/electrostrictive film is appropriately determined by the material constituting the film, and is generally 800° C. to 1400° C., preferably 1100° C. to 1350° C. In this case, to control the composition of the piezoelectric/electrostrictive film, the film is preferably sintered under existence of an evaporation source of the material of the piezoelectric/electrostrictive film. It is to be noted that to simultaneously fire the piezoelectric/electrostrictive film and ceramic green laminate, it is necessary to unify both the firing conditions.

Next, a second manufacturing method will be described. The second manufacturing method is a method in which the material containing titanium oxide beforehand is used as the ceramic material constituting the substrate section. The method conforms to the first manufacturing method except two respects. In the first manufacturing method described above, as the raw materials of all the green sheets or as the raw material of at least the green sheet A, the ceramic powder such as zirconium oxide is mixed with titanium oxide in addition to the binder, solvent, dispersant, and plasticizer to prepare and use the slurry. Moreover, it is not necessary to use the conductor material containing titanium oxide as the material of the electrode film of the lowermost layer of the operation section which contacts the substrate section. Therefore, a concrete description of the process of preparing the piezoelectric/electrostrictive device made of piezoelectric/electrostrictive film according to the present invention based on the second manufacturing method is omitted.

EXAMPLES

Effects of the present invention will be described hereinafter based on concrete examples.

Example 1

The piezoelectric/electrostrictive device made of piezoelectric/electrostrictive film whose substrate section is constituted of the ceramic containing the titanium element was prepared and evaluated as follows.

Figure 11:
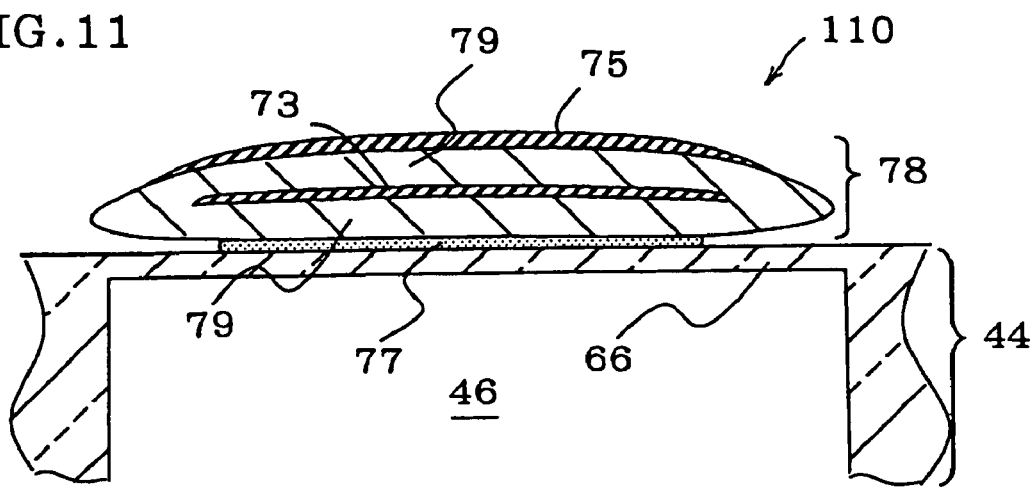
FIG. 11 is a sectional view showing the piezoelectric/electrostrictive devices made of piezoelectric/electrostrictive film prepared in the embodiment.
Figure 12:
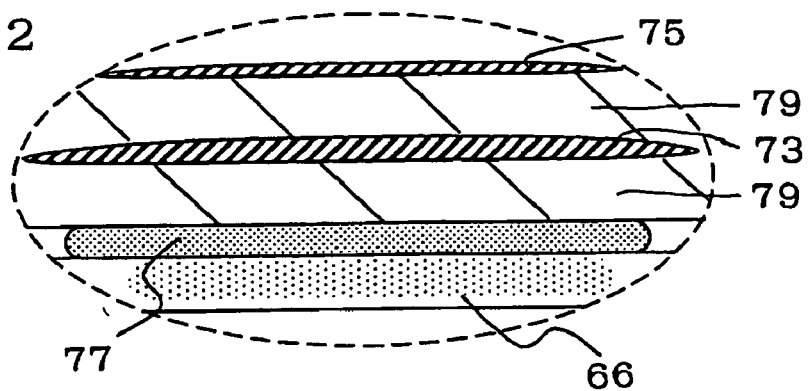
FIG. 12 is a further partially enlarged sectional view of the piezoelectric/electrostrictive devices made of piezoelectric/electrostrictive film shown in FIG. 11.

FIG. 11 is a diagram showing a partial section of the prepared piezoelectric/electrostrictive device made of piezoelectric/electrostrictive film, and FIG. 12 is a further partially enlarged sectional view. A piezoelectric/electrostrictive device 110 made of piezoelectric/electrostrictive film includes five layers in total including the electrode film 77, piezoelectric/electrostrictive film 79, electrode film 73, piezoelectric/electrostrictive film 79, and electrode film 75 in order from below in the drawing as the operation section 78 on the diaphragm plate 66 which is a part of the substrate section 44. The device includes a constitution in which the electrode films 73, 75, 77 and piezoelectric/electrostrictive films 79 having predetermined widths are alternately laminated.

As the materials of the constituting elements of the piezoelectric/electrostrictive device 110 made of piezoelectric/electrostrictive film, partially stabilized zirconium oxide was used in the substrate section 44, platinum to which 2% by mass of titanium oxide was added was used in the electrode film 77, platinum was used in the electrode film 73, the material in which nickel oxide was added to three-components material of lead zirconate, lead titanate, and lead magnesium niobate was used in two layers of piezoelectric/electrostrictive films 79, and gold was used in the electrode film 75.

First, the green sheet laminating method was used to obtain the ceramic green laminate, and the laminate was fired at a temperature of 1450° C. to prepare the substrate section 44. Subsequently, the screen printing method was used to form the piezoelectric/electrostrictive film and electrode film in predetermined positions on the fired substrate section 44, and the operation section 78 was prepared. In more detail, first after printing the electrode film 77 on the substrate section 44, the film was fired at 1300° C. and integrated with the substrate section 44. Thereafter, the piezoelectric/electrostrictive film 79, electrode film 73, and piezoelectric/electrostrictive film 79 were printed, these three layers were altogether fired at 1250° C., and the electrode film 77 and substrate section 44 were integrated. Finally, the electrode film 75 was printed, and fired at 800° C. It is to be noted that the electrode films 75 and 77 were patterned so as to electrically have the same potential. The thicknesses of the electrode films and piezoelectric/electrostrictive films constituting the operation section 78 were set to 3 μm (electrode film 77), 5 μm (piezoelectric/electrostrictive film 79), 2 μm (electrode film 73), 5 μm (piezoelectric/electrostrictive film 79), and 0.2 μm (electrode film 75) from the side close to the substrate section 44 after the firing. It is to be noted that as a result of measurement of the content of the titanium element using an electron probe micro analyzer method (EPMA) with respect to the section of the diaphragm plate 66 in the piezoelectric/electrostrictive device 110 made of piezoelectric/electrostrictive film, many titanium elements existed in the portion projected by the electrode film 77, and the content was 2.0% by mass in the titanium oxide equivalent amount.

The residual stress of the piezoelectric/electrostrictive film 79 as the constituting element was evaluated with respect to the prepared piezoelectric/electrostrictive device 110 made of piezoelectric/electrostrictive film following the method disclosed in Japanese Patent Application Laid-Open No. 6-350155. In the method, the stress applied to the piezoelectric/electrostrictive device 110 made of piezoelectric/electrostrictive film is used which changes the material characteristics of the piezoelectric/electrostrictive film 79 and which appears as an increase or decrease of a dielectric constant. Concretely, slits were formed in a thick portion around the cavity 46 of the substrate section 44, the dielectric constant was obtained from capacitance of the piezoelectric/electrostrictive device 110 made of piezoelectric/electrostrictive film before/after slit processing, and the residual stress was evaluated from the change. Values of the capacitance are shown in Table 1.

TABLE 1

| | Capacitance before slit processing | Capacitance after slit processing |
| --- | --- | --- |
| Example 1 | 330 pF | 330 pF |
| Comp. Example 1 | 280 pF | 330 pF |

Figure 13:
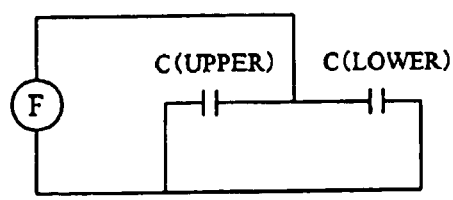
FIG. 13 is a diagram showing a mode of connection (juxtaposition) of two piezoelectric/electrostrictive films in measuring capacitance in the embodiment.

It is to be noted that the capacitance indicates the values at which the two piezoelectric/electrostrictive films 79 are in a juxtaposed state as shown in FIG. 13. The capacitance has a value as designed (330 pF) before the slit processing. The dielectric constant obtained from the capacitance was 1600 which was extremely close to a bulk value of the piezoelectric material. Moreover, the change was hardly seen in the capacitance even after the slit processing.

Comparative Example 1

The piezoelectric/electrostrictive device made of piezoelectric/electrostrictive film (referred to as a piezoelectric/electrostrictive device 120 made of piezoelectric/electrostrictive film) was prepared in the same manner as in Example 1 except that the material of the electrode film 77 of the lowermost layer (in the vicinity of the diaphragm plate 66) was platinum not containing titanium oxide in the same manner as in the electrode film 73, and the device was evaluated in the same manner as in Example 1. It is to be noted that as a result of the measurement of the content of the titanium element by the method similar to that of Example 1 with respect to the section of the diaphragm plate 66 in the piezoelectric/electrostrictive device 120 made of piezoelectric/electrostrictive film, the content was extremely small and 0.1% or less by mass in Comparative Example 1. The values of the capacitance are shown in Table 1.

The capacitance indicates a decrease of the designed value by about 15% (280 pF) before the slit processing, and indicates a value as designed (330 pF) after the slit processing.

Consideration

Considering from a relation between the material characteristics and the stress, in the conventional piezoelectric/electrostrictive device 120 made of piezoelectric/electrostrictive film in which the capacitance does not satisfy the designed value, the value of the capacitance largely changes by the slit processing (increases), and the ceramic substrate does not contain titanium oxide, harmful stress supposedly remains in the piezoelectric/electrostrictive film 79. That is, in the (piezoelectric/electrostrictive) operation section constituted of different kind of materials, the stress of the contraction remains in a film surface direction in the piezoelectric/electrostrictive film, and this stress is supposed to deteriorate the material characteristics. On the other hand, for the piezoelectric/electrostrictive device 110 made of piezoelectric/electrostrictive film containing titanium oxide according to the present invention, the capacitance does not change, and it can be said that the stress during the firing hardly remains in the piezoelectric/electrostrictive film 79.

As described above, according to the present invention, there is provided a superior piezoelectric/electrostrictive device made of piezoelectric/electrostrictive film which does not include the structure laminated using the adhesive and in which high integration is easily possible. With the actuator, a larger displacement is obtained with the same driving voltage, the response speed is high, and the generation force is large. On the other hand, with the sensor, there is provided a highly sensitive piezoelectric/electrostrictive device made of piezoelectric/electrostrictive film capable of showing a large electromotive force at time of sensing. The piezoelectric/electrostrictive device made of piezoelectric/electrostrictive film according to the present invention is especially preferable as the actuator for the printer head of the ink jet printer which has been requested to be further miniaturized and more highly integrated in pursuit of image quality enhancement in recent years.

Moreover, since the piezoelectric/electrostrictive device made of piezoelectric/electrostrictive film according to the present invention has the above-described features, the device can preferably be used not only as the actuator but also as an active element such as a transducer, a frequency region function component (filter), a vibrator, resonator, or oscillator of a transformer, a discriminator, and a sensor device for various sensors, a capacitor device, and the like.

What is claimed is:

1. A method of manufacturing a piezoelectric/electrostrictive device which comprises a substrate section, and an operation section disposed on the substrate section, which includes at least one piezoelectric/electrostrictive film and a plurality of electrode films, so that the piezoelectric/electrostrictive device is capable of operating by displacement of the operation section, wherein the at least one piezoelectric/electrostrictive film and the electrode films are alternately laminated so that an uppermost layer and a lowermost layer of the operation section are defined by the electrode films, and wherein the operation section and the substrate section are integrated by firing, the method comprising the steps of:

providing a conductor material, including 0.3 to 8 mass % titanium oxide, as a material of the electrode film defining the lowermost layer of the operating section in contact with the substrate section; and performing a heat treatment step of the conductor material and the substrate section at a temperature in a range of 1200° C. to 1450° C. so that a titanium element from the conductor material is diffused into the substrate section.

2. The according to claim 1, wherein an average particle size of the titanium oxide in the conductor material is in a range of 0.05 to 0.4 µm.

3. A method of manufacturing a piezoelectric/electrostrictive device which comprises a substrate sections, and an operation section disposed on the substrate section, which includes at least one piezoelectric/electrostrictive film and a plurality of electrode films, so that the piezoelectric/electrostrietive device is capable of operating by displacement of the operation section, wherein the piezoelectric/electrostrictive film and the electrode films are alternately laminated so that an uppermost layer and a lowermost layer of the operation section are defined by the electrode films, and wherein the operation section and the substrate section are integrated by firing, the method comprising a step of:

providing the substrate section comprising a ceramic material containing titanium oxide before integrating the substrate section and the operation section by firing at a temperature in a range of 1200° C. to 1450° C. so that a titanium element from a conductor element of the electrode film defining the lowermost electrode layer of the operation section is diffused into the substrate section, so that a titanium content in the ceramic material of the substrate section within a projected section of the substrate section, defined by projecting the electrode film of the lowermost electrode layer of the operation section onto the substrate section, is different from a titanium content of the ceramic material in a non-projected section which is a section other than the projected section of the substrate section.

* * * * *